United States Patent [19]
Varshney et al.

[11] Patent Number: 5,534,071
[45] Date of Patent: Jul. 9, 1996

[54] INTEGRATED LASER ABLATION DEPOSITION SYSTEM

[75] Inventors: Usha Varshney, Radford; Lawrence H. Decker, Christiansburg, both of Va.

[73] Assignee: American Research Corporation, Radford, Va.

[21] Appl. No.: 240,458

[22] Filed: May 10, 1994

Related U.S. Application Data

[63] Continuation-in-part of Ser. No. 852,078, Mar. 13, 1992.

[51] Int. Cl.$^6$ ................................................ C23C 14/00
[52] U.S. Cl. ........................ 118/726; 118/727; 118/730; 427/596
[58] Field of Search .................................. 118/726, 727, 118/730; 427/595, 596; 505/732; 117/86

[56] References Cited

U.S. PATENT DOCUMENTS

| | | | |
|---|---|---|---|
| 3,797,452 | 3/1974 | Dobson | 118/730 |
| 4,714,625 | 12/1987 | Chopra | 427/595 |
| 5,015,492 | 5/1991 | Venkatesan | 118/726 |
| 5,131,752 | 7/1992 | Yu | 427/10 |
| 5,133,286 | 7/1992 | Choo | 118/726 |
| 5,207,884 | 5/1993 | Char | 118/727 |
| 5,227,204 | 7/1993 | Vittoria | 427/596 |
| 5,254,832 | 10/1993 | Gartner | 427/596 |
| 5,261,961 | 11/1993 | Takasu | 118/722 |
| 5,322,817 | 6/1994 | James | 427/595 |

FOREIGN PATENT DOCUMENTS 2-92898  4/1990  Japan ........................................ 117/86

OTHER PUBLICATIONS

Muenchausen, Appl. Phys. Lett. 56(6), 5 Feb. 1990, pp. 578–580.
Shi, Appl. Phys Lett. 59(11), 9 Sep. 1991, pp. 1377–1379.
Miura, Appl. Phys. Lett. 52(12), 21 Mar. 1988, pp. 1008–1010.
Wu, Appl. Phys. Lett. 56(4), 22 Jan. 1990, pp. 400–402.
Chrisey, Pulsed Laser Deposition of Thin Films, John Wiley & Sons, Inc. New York, © 1994, published Feb. 1, 1994, pp. 38–48 & 300–301.
Pham, J. Vac. Sci Technol. A9(2), Mar./Apr. 1991, pp. 271–273.
Koren, Appl. Phys. Lett. 53(23), 5 Dec. 1988, pp. 2330–2332.

Primary Examiner—Richard Bueker
Attorney, Agent, or Firm—Dickstein, Shapiro & Morin

[57] ABSTRACT

A laser ablation deposition system includes a movable platform for supporting ferroelectric target material and a support structure for supporting a thermally sensitive semiconductor substrate within a chamber mounted on a moveable cabinet, and a laser for ablating the material mounted on a support frame along with various control components. The cabinet with the chamber may be moved away from the laser and support frame to allow the chamber to be raised to provide access to the components within the chamber. The system may be used to fabricate a multilayer thin film device using multicomponent oxides.

22 Claims, 10 Drawing Sheets

INTEGRATED LASER ABLATION DEPOSITION SYSTEM

This is a continuation-in-part of U.S. patent application Ser. No. 07/852,078, filed Mar. 13, 1992, the entire disclosure of which is incorporated herein by reference.

BACKGROUND OF THE INVENTION

The present invention relates generally to an integrated laser ablation deposition system. The invention also relates to a system for fabricating multicomponent, multilayer thin film structures for micro-technologies.

It is desirable to fabricate multicomponent, multilayer thin film structures for various applications. For example, ferroelectric thin films, including films formed of lead zirconate titanate (PZT), provide advantages in connection with the construction of computer memories. These advantages include but are not limited to high bit-density, non-volatility, low-voltage operation over a wide temperature range, high speed, short access and cycle times, and relatively high radiation hardness. However, it has heretofore been difficult to satisfactorily deposit ferroelectric thin films on the temperature sensitive semiconductor substrates (such as Si and GaAs) typically used in integrated circuits. Furthermore, an integrated, compact and portable laser ablation deposition system has heretofore not been available.

SUMMARY OF THE INVENTION

The present invention overcomes the disadvantages of the prior art by providing an integrated, compact and portable laser ablation deposition system for depositing films onto a substrate, including a vacuum system, a vacuum chamber, a movable platform for supporting the material, a support structure for supporting the substrate, a laser for ablating the material, a component support frame, and a computer for integrating the operation of all of the subsystems.

In one aspect of the invention, the vacuum chamber is supported on a vacuum cabinet containing the vacuum system, and the laser, computer, and other control components are supported on the component support frame.

In another aspect of the invention, the vacuum chamber cabinet and component support frame may be moved apart to facilitate removal of the chamber from the vacuum system.

In another aspect of the invention, the chamber is cross shaped, and positioned over a vacuum pump.

In another aspect of the invention, the platform is rotatable about first and second axes, and also movable in a lateral direction.

In another aspect of the invention, the system has more than one movable platform, and is capable of sequentially ablating more than one type of target material.

In another advantageous aspect of the invention, the substrate support structure is hemispherical, and has first and second openings aligned with the laser beam and the substrate, respectively.

In another aspect of the invention, a movable shutter selectively covers the second opening to control the deposition process.

In another aspect of the invention, the laser ablation deposition system is integrated, compact and easily portable.

In another aspect of the invention, a computer receives signals from a thickness monitor and a temperature sensor, and automatically controls the laser ablation deposition process responsive to the signals.

In a preferred aspect of the present invention, the substrate may be formed of a thermally sensitive semiconductor material.

In another advantageous aspect of the invention, the fabricated device includes a PZT thin film.

An object of the present invention is to provide a system for producing low temperature as-deposited crystalline multicomponent ferroelectric thin films on temperature sensitive semiconductor substrates. In a preferred embodiment of the invention, the laser ablation deposition system may be used to produce PZT ferroelectric thin films for use in non-volatile random access memories having improved speed, reliability and performance.

Another object of the invention is to provide a system for ensuring the exposure of fresh material to be ablated, to minimize cratering of the material, and to minimize differential ablation effects.

Another object of the invention is to provide a system for reliably fabricating thin films with desired stoichiometries.

Another object of the invention is to provide a system for moving target material in a spiral pattern with respect to an incident laser beam.

Another object of the invention is to provide a system for controlling laser ablation deposition as a function of set point and end thicknesses.

Another object of the invention is to provide a system that is integrated, compact and portable.

Another object of the invention is to provide a system that is relatively easy to operate, service and maintain.

The present invention may be used to reliably deposit multicomponent structures such as PZT layers onto a semiconductor substrate at relatively low temperatures. A computer-controlled system constructed in accordance with the invention may be used to lower the deposition temperature of the as-deposited, ferroelectric thin film layers to about 525° C. Laser ablation deposition at relatively low substrate temperatures provides for short range interdiffusion while minimizing long range interdiffusion between the ferroelectric thin film and a buffer layer provided on the substrate, and interdiffusion between the top and bottom electrodes with the ferroelectric film and the substrates.

Laser ablation is an advantageous process for deposition because it produces a plume with high energy atomic species, preferably with energies in the range of 100–200 eV. The high energy atomic species have high surface mobility on the substrate, permitting the fabrication of high quality, well-crystallized films at low substrate temperatures. Moreover, a high laser energy density (e.g., approximately 20 J/cm$^2$) may be employed to increase the kinetic thermal energy of the depositing species, with improved results in terms of forming crystalline films at low deposition temperatures.

With the present invention, highly oriented large grain polycrystalline or epitaxial ferroelectric thin films can be produced at deposition temperatures as low as 525° C. The ferroelectric thin films will have improved speed, reliability, performance, aging and fatigue properties as well as improved retention characteristics, which when combined with a thermally sensitive semiconductor substrate will enable the production of non-volatile ferroelectric random access memories.

Other objects, features and advantages of the present invention will be apparent from the following detailed description and drawings.

DETAILED DESCRIPTION OF PREFERRED EMBODIMENTS

Figure 1:
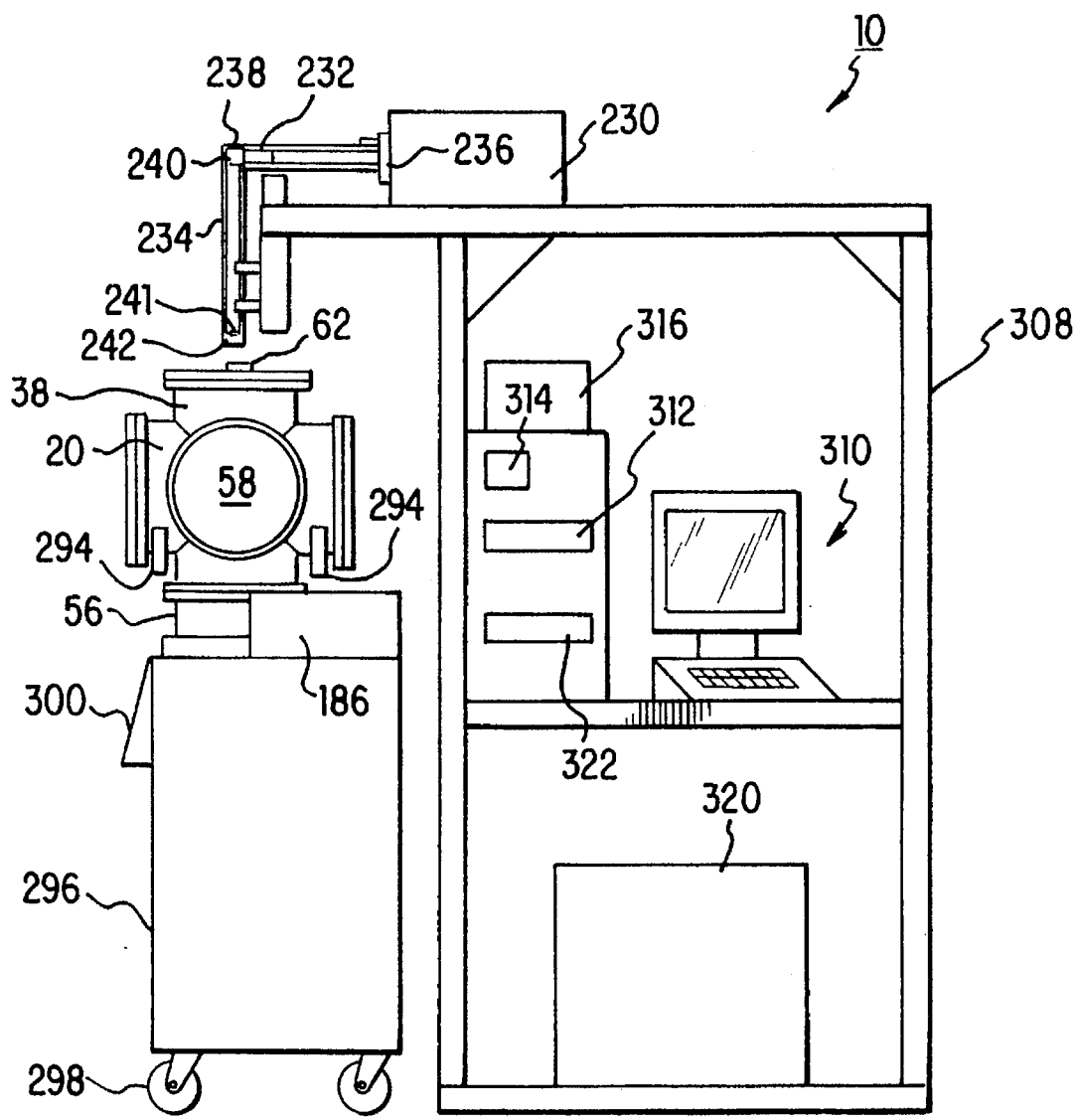
FIG. 1 is a front view of an integrated laser ablation deposition system constructed in accordance with the present invention.

Referring now to the drawings, where like reference numerals indicate like elements, there is shown in FIG. 1 a laser ablation deposition system 10 constructed in accordance with the present invention. Laser ablation deposition chamber 20 is mounted on cabinet 296 which houses vacuum system 56. Control panel 300 is located on the front of cabinet 296 for controlling vacuum system 56. Also mounted on top of cabinet 296 is 3-axis motion controller system 186. Laser 230 is mounted on top of component support frame 308. Laser shutter 236 is on the front of laser 230. The beam from the laser 230 is directed to window 62 in port 38 of chamber 20 by way of low loss mirror 240 in mirror mount 238, and lens 241 mounted in adjustable lens holder 242. The lens and mirror are supported by two sets of rods 232 and 240 which are positioned at right angles to each other.

Mounted in frame 308 is computer 310, thickness monitor 312, temperature controller 314, laser frequency generator 322 and laser controller 316. Also mounted in frame 308 is laser power supply 320. Cabinet 296 may be rolled by means of wheels 298 away from frame 308. This facilitates the raising of chamber 20 off of cabinet 296 to provide access to the components within chamber 20. Alternatively, it is possible to mount frame 308 on wheels to move the frame away from cabinet 296 and chamber 20. The operation and function of these components, and others, is described below with reference to the other figures.

Figure 2:
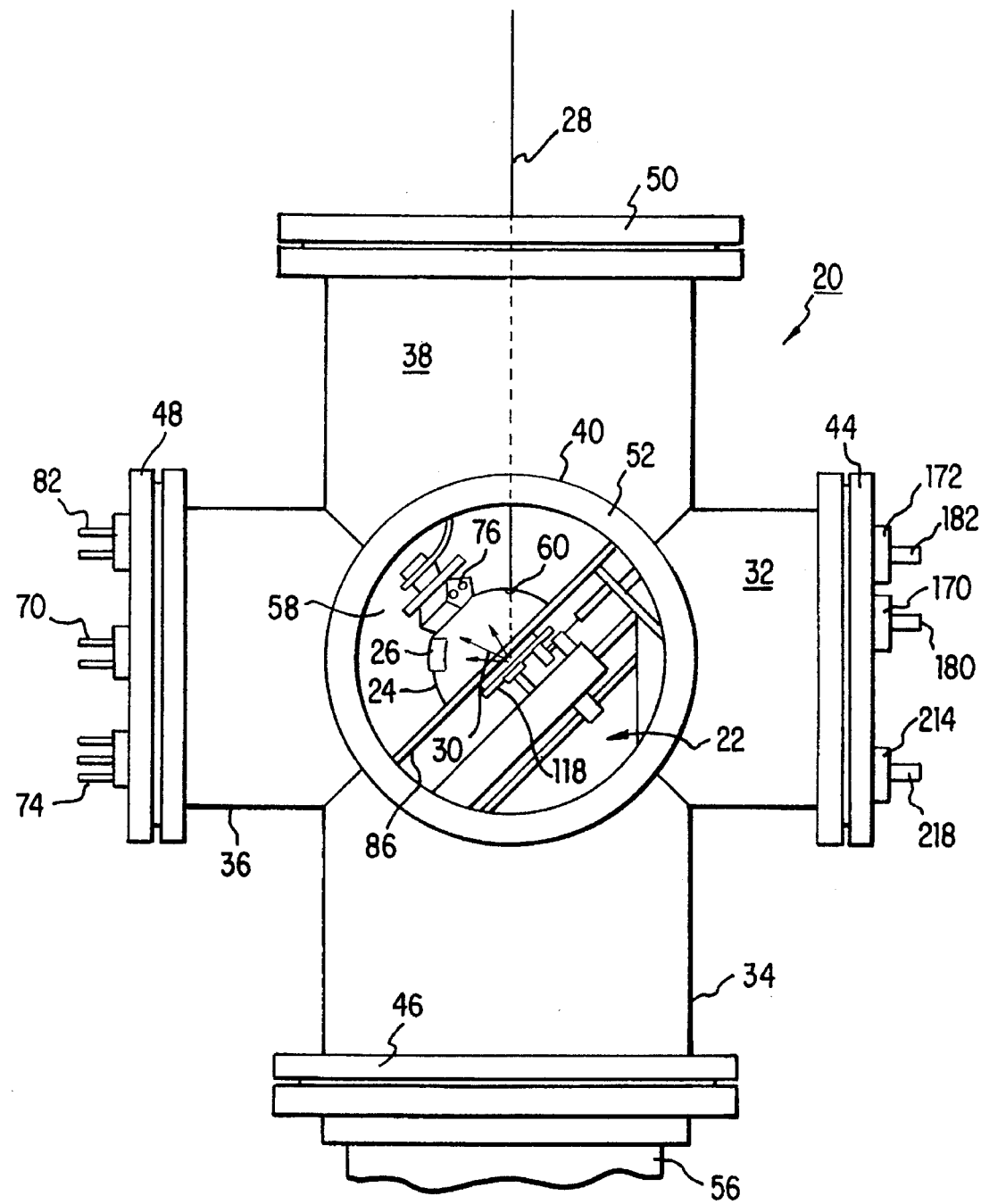
FIG. 2 is a front view of a laser ablation deposition chamber constructed in accordance with the present invention.

Illustrated in FIG. 2 is laser ablation deposition chamber 20 constructed in accordance with the present invention. A system 22 for movably supporting target material is located within the chamber 20. A hemispherical member 24 for supporting a substrate 26 is located above the target material support system 22.

In operation, the space within the chamber 20 is evacuated and a laser beam 28 is transmitted downwardly into the chamber 20 to ablate the target material. The ablated target material forms a plume 30 that is deposited on the substrate 26 to form a thin film device. The substrate 26 may be formed of a thermally sensitive semiconductor material, such as Si or GaAs. The target material may be pellets of $PbO$, $ZrO_2$ and $TiO_2$, or PZT bulk materials, or Pb, Ti and Zr metals. The thin film device fabricated by the present invention may be a ferroelectric PZT thin film device.

Figure 3:
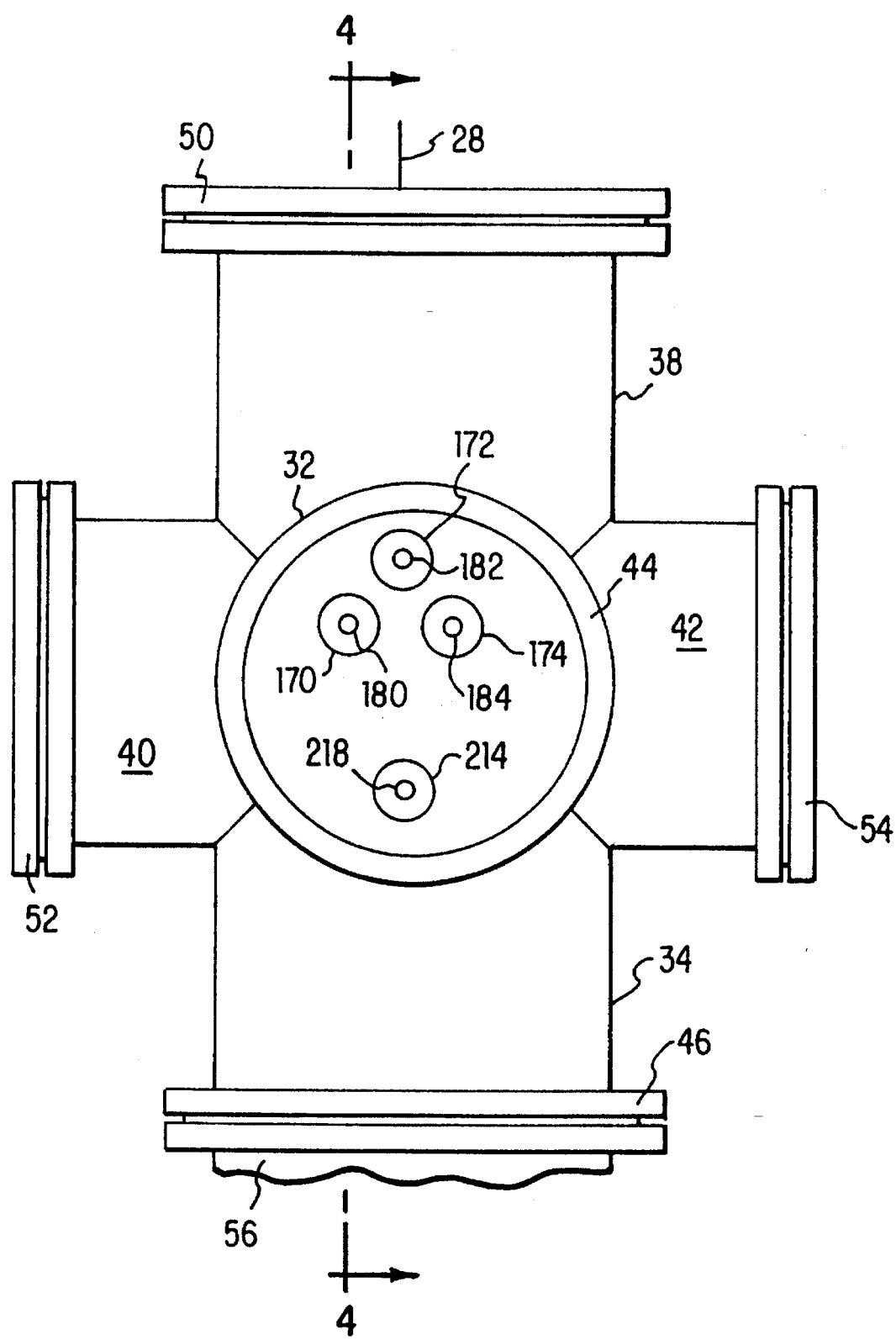
FIG. 3 is a side view of the chamber of FIG. 2.

As illustrated in FIGS. 2 and 3, the chamber 20 is in the form of a stainless steel cross having six ports 32, 34, 36, 38, 40, 42. Rear port 42 is hidden from view in FIG. 2, and side port 36 is hidden from view in FIG. 3. In the illustrated embodiment, the top and bottom ports 38, 34 are each approximately 10 inches (25 centimeters) in diameter, and the other ports 32, 36, 40, 42 are each approximately 8 inches (20 centimeters) in diameter. The ports 32, 34, 36, 38, 40, 42 are each vacuum sealed by suitable O-rings and stainless steel end plates 44, 46, 48, 50, 52, 54. In the illustrated embodiment, the distance from the center of the chamber 20 (where the laser beam 28 is incident on the target material) to the respective end plates 44, 46, 48, 50, 52, 54 is about 10 inches (25 centimeters) in all six directions.

The cross shaped construction of the chamber 20 maximizes accessibility to the interior of the chamber 20 while minimizing the volume that must be evacuated during the laser ablation deposition process.

The chamber 20 is evacuated by a vacuum system 56. The vacuum system 56 is releasably connected to the bottom port 34 through the bottom end plate 46, as discussed in more detail below. The vacuum system 56 may be a commercially available DENTON Model DV 502A vacuum pump system or equivalent, and may include a diffusion pump backed by a mechanical pump and a liquid nitrogen cold trap. In a preferred embodiment of the invention, the vacuum system 56 is capable of maintaining the base pressure within the reactor chamber 20 at $10^{-7}$ Torr, and preferably maintains the base pressure within the reactor chamber 20 at 100 millitorr during the laser ablation deposition process.

Suitable means (not illustrated) may also be provided for introducing oxygen into the reactor chamber 20.

The front port 40 has a window 58 for observing the interior of the chamber 20. In a preferred embodiment of the invention, the front port 40 may be opened to remove and replace the substrate 26 and the laser ablation target materials held by target platforms 100, 102 and 104.

Figure 4:
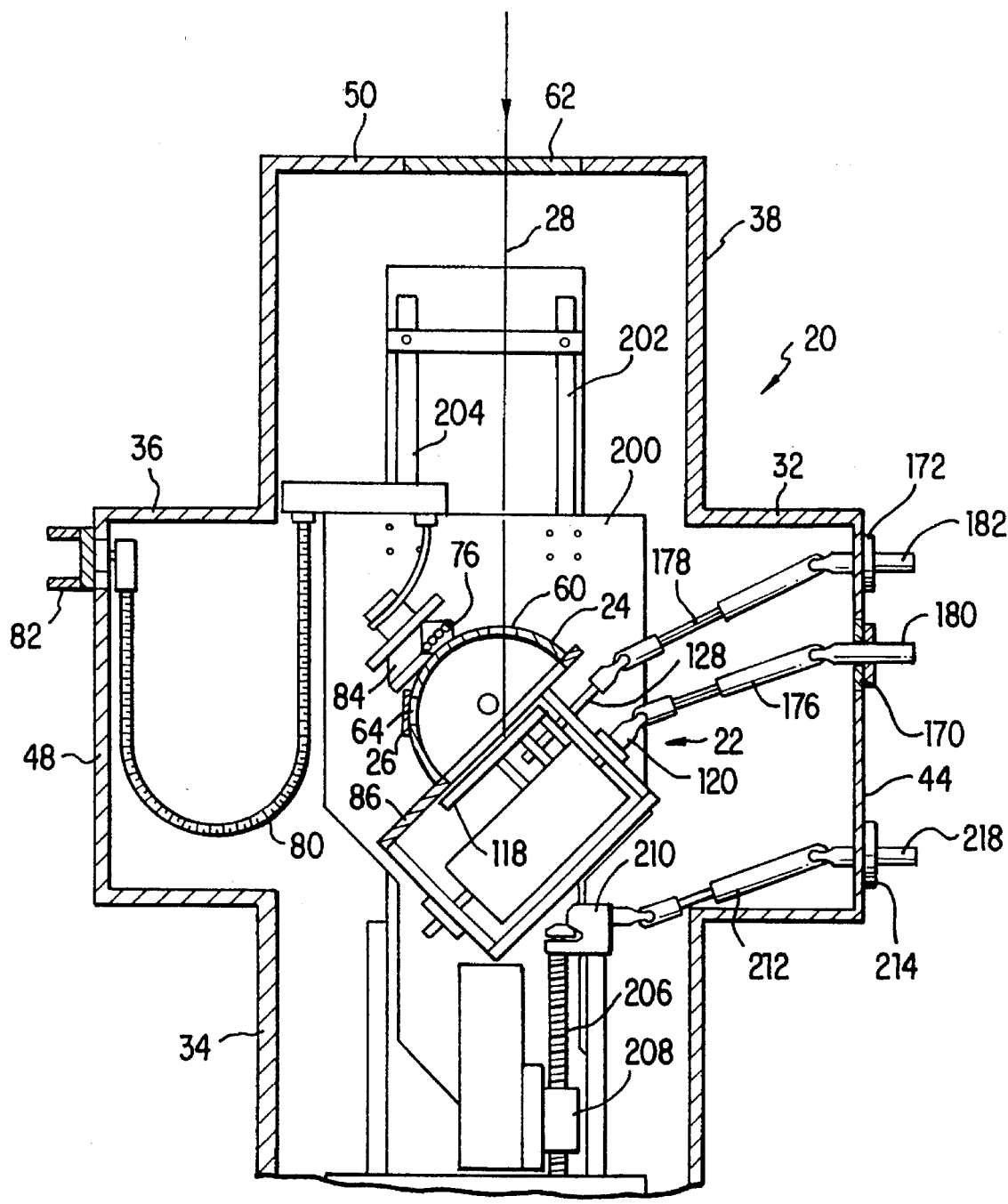
FIG. 4 is a cross-sectional view of the chamber of FIG. 1, taken along the line 4—4 of FIG. 3.

Referring now to FIG. 4, the hemispherical support structure 24 has a top opening 60, and the top end plate 50 has a window 62. In operation, the laser beam 28 is transmitted downwardly through the window 62, through the opening 60 in the hemispherical member 24, and focused on the target material held by target platforms 100, 102 and 104 (illustrated in FIG. 6).

Figure 5:
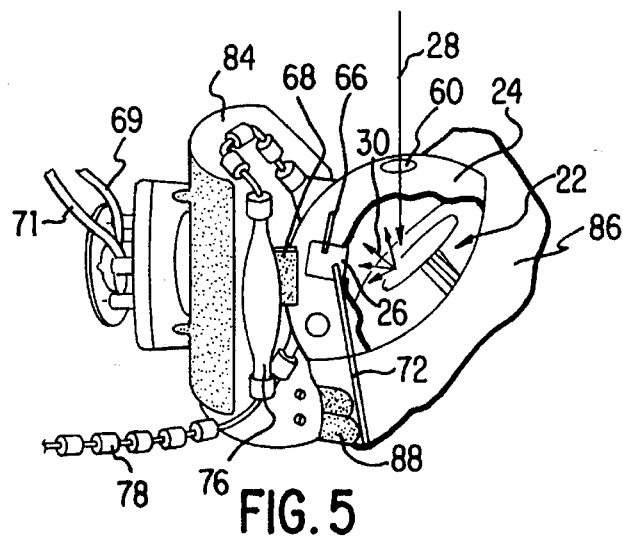
FIG. 5 is a partially broken away perspective view of an inner portion of the chamber of FIG. 2.

The hemispherical member 24 also has a substrate support opening 64 as shown in FIG. 4. As illustrated in FIG. 5, the substrate 26 is removably held by a clip 66 over the opening 64 (hidden by substrate 26 in this view). The substrate support opening 64 is preferably located about five centimeters above the target material.

In operation, after a thin film of the target material is deposited on the substrate 26 to the desired thickness, the substrate 26 may be removed from the clip 66 and withdrawn from the chamber 20 through the front port 40. A new substrate may then be positioned over the opening 64 to form a second thin film device. It is also possible to replace or change the target materials on holders 100, 102, 104 through the front port 40 to continue the deposition process on the original substrate 26 or on a new substrate.

An advantage of the hemispherical shape of the substrate holder 24 is that it allows the substrate 26 to be mounted at any angle with respect to the target material. The plume 30 is stoichiometrically non-homogeneous and non-symmetrical. Therefore, films with different stoichiometries and other characteristics may be obtained by locating the substrate 26 at different positions. For the illustrated embodiment, the preferred location for the substrate 26 to receive a high quality PZT ferroelectric film deposition is such that a line from the target material to the substrate support opening 64 forms an angle of about 85° with the incident laser beam 28.

A thickness monitor extension 68 (FIG. 5) is mounted on the hemispherical substrate support 24 to provide monitor head 67 unobstructed access to the ablated plume through monitor head opening 283 (not seen). During the deposition process, target material is deposited on the monitor head 67 at substantially the same rate as on substrate 26. The monitor head 67 is thereby used to indirectly determine the thickness of the film deposited on the substrate 26. The system performs well when a line from the target material to the thickness monitor head 67 forms an angle of about 95° with the incident laser beam 28. The substrate 26 and the thickness monitor head 67 are preferably mounted on the hemispherical substrate holder 24 within a 30° to 40° solid angle cone formed normal to the target material. Water cooling lines 69, 71 are provided for maintaining the monitor head 67 at the desired temperature. The stainless steel flexible bellows 80 connects the water lines to the exterior and allows for adjustment of the height of carriage 200. The thickness monitor head 67 is connected by a suitable signal line (not shown) to an electrical connector 70 (FIG. 2). The thickness monitor may be an STM-100 monitor marketed by SYCON INSTRUMENTS or equivalent.

A thermocouple 72 (FIG. 5) is used to monitor the temperature of the semiconductor substrate 26. The thermocouple 72 is connected to a second connector 74 (FIG. 2) by a suitable signal line (not illustrated).

Tungsten quartz halogen lamps 76 (FIG. 5) may be used to heat the substrate 26. In the illustrated embodiment, the lamps 76 are powerful enough to heat the substrate 26 to a temperature of up to 900° C., but lower temperatures would be used to form ferroelectric thin film devices on thermally sensitive substrates. Electrical power for the lamps 76 is supplied through insulated flexible cables 78 and a connector 74.

An advantage of the flexibility of the cables 78 is that the lamps 76 along with the target material support system 22 may be moved up and down relative to the chamber 20 to focus the beam 28 and/or to remove the chamber 20 from the vacuum system 56, as described in more detail below.

A heat shield/reflector 84 surrounds the lamps 76. As illustrated in FIG. 5, the heat shield/reflector 84 is rigidly connected to the hemispherical member 24 by a support plate 86 and suitable posts 88.

Figure 6:
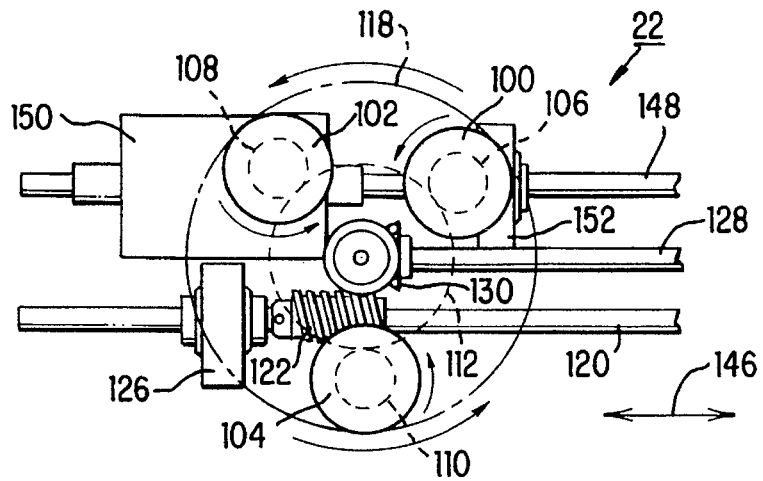
FIG. 6 is a schematic top view of a target material support system for the chamber of FIG. 2.
Figure 7:
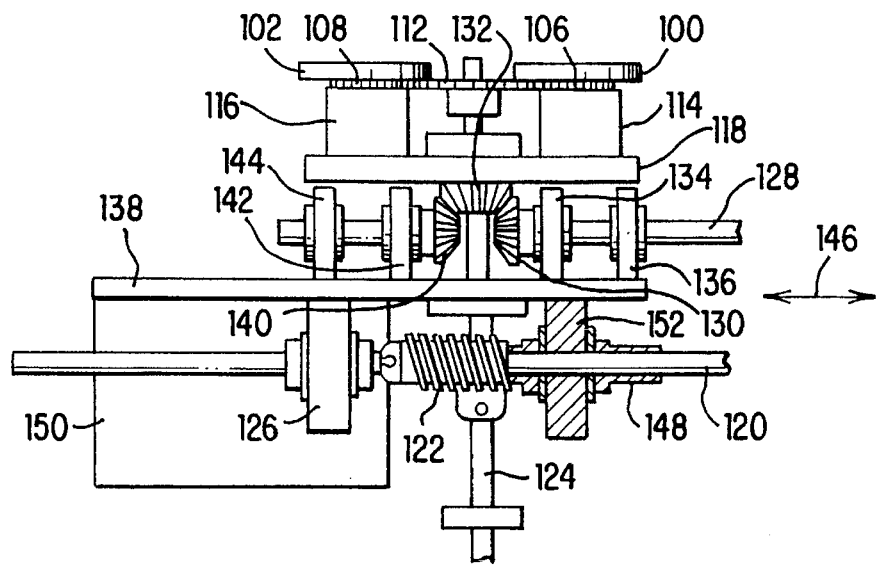
FIG. 7 is a side view of the target material support system of FIG. 6.

Referring now to FIGS. 6 and 7, the target pellets may be supported on individual target platforms 100, 102, 104. When, for example, the system 10 is used to form a PZT structure, PbO pellets are located on the first platform 100, $ZrO_2$ pellets are located on the second platform 102, and $TiO_2$ pellets are located on the third platform 104. The target platforms 100, 102, 104 are mounted at the center of the chamber 20 and each can be positioned to form an angle of about 45° with respect to the substantially vertical laser beam 28.

As illustrated in FIGS. 6 and 7, the target material support system 22 includes means for controlled movement of the target platforms 100, 102, 104 so that the desired type of target material is ablated at the desired times and so that the laser beam 28 is always incident on fresh target material.

The target platforms rotating means includes planet gears 106, 108, 110 and a sun gear 112. The sun gear 112 meshes with the planet gears 106, 108, 110. The planet gears 106, 108, 110 are rotatably supported by respective bearings 114, 116, only two of which are visible in FIG. 7. The third target platform 104 and its associated planet gear 110 and bearing are not shown in FIG. 7 for purposes of clarity.

The three bearings 114, 116 are positioned on and rotate together with a multi-target rotation table 118. For purposes of clarity, only the circular periphery of the table 118 is shown in FIG. 6. Preferably, the table 118 is tilted to an angle of about 45° with respect to the laser beam 28. The table 118 is shown in a horizontal position in FIG. 7 solely for purposes of clarity.

The sun gear 112 is rotated by a target rotational shaft 120, a worm gear system 122 and a central shaft 124. Rotation of the shaft 120 causes the worm gear system 122 to rotate the central shaft 124. The central shaft 124 rotates the sun gear 112, which meshes with the planet gears 106, 108, 110 to rotate the target platforms 100, 102, 104. The target rotational shaft 120 is supported for rotation by a suitable bearing 126.

The multi-target rotation table 118 is rotated through 120° angles around the central shaft 124 by a target select shaft 128 and first and second pinion gears 130, 132. The axis of the central shaft 124 is substantially parallel to the axes of rotation for the target platforms 100, 102, 104. The second pinion gear 132 meshes with the first pinion gear 130 and is fixed with respect to the table 118. Therefore, rotation of the target select shaft 128 causes the table 118 (and the target platforms 100, 102, 104) to rotate around the central shaft 124.

The target select shaft 128 is supported for rotation by bearings 134, 136. The bearings 134, 136 are in turn fixed on a platform 138. A third pinion gear 140 is provided on suitable bearings 142, 144, also fixed on the platform 138, for stabilizing the second pinion gear 132. For purposes of clarity, the platform 138 is not shown in FIG. 6.

The rotation of the target select shaft 128 may be controlled such that all three target platforms 100, 102, 104 are sequentially located under the laser beam 28, to deposit, for example, a PZT layer.

In a preferred embodiment of the invention, the platform 138 may be moved back and forth in lateral directions 146 by a target tracking shaft 148 and a linear actuator 150. In the illustrated embodiment, the lateral directions of movement 146 for the platform 138 form an angle of about 45° with the horizontal. The lateral directions 146 are substantially perpendicular to the central shaft 124. The actuator 150 may be a Model Zero Max Roh'Lix No. 1 linear actuator or equivalent. The target tracking shaft 148 is supported by a combined linear and rotational bearing set 152.

The illustrated arrangement ensures that the laser beam 28 always impinges on fresh target material to minimize cratering and differential ablation effects, and to thereby maintain the desired stoichiometry in the deposited film. In particular, the target rotational shaft 120 and the target tracking shaft 148 may be operated simultaneously to move the target material under the laser beam 28 in a spiral pattern. In the illustrated embodiment, the diameter of each target platform 100, 102, 104 is about one inch and the linear actuator 150 is arranged to provide a total linear travel distance of about one-half inch, to maximize the exposure of target material under the spiral pattern. The present invention may also be programmed to operate the target rotational shaft 120 and the target tracking shaft 148 at different times to provide circular and linear exposure patterns.

The target rotational shaft 120, target select shaft 128, and target tracking shaft 148 are connected to mechanical input connectors 170, 172, 174 (FIGS. 2 and 3) by respective extendible universal joints 176, 178 (FIG. 4). The extendible universal joint for connecting the target tracking shaft 148 to the respective connector 174 is not shown in the drawings, but is essentially identical in structure to the other universal joints 176, 178. The input connectors 170, 172, 174 are in turn connected to respective motors 180, 182, 184. The motors 180, 182, 184 are controlled by a three axis motion controller system 186 shown schematically in FIG. 14. The controller system 186 may include, for example, a NEAT 203 controller or equivalent.

Referring again to FIG. 4, the target material support system 22 and the substrate holder 24 are mounted to a carriage 200. The carriage 200 is slidably mounted on carriage shafts 202, 204 such that the target material support system 22 may be moved up and down to focus the laser beam 28 on the target material. A screw shaft 206 and follower 208 drive the carriage 200 vertically. The screw shaft 206 is connected through bevel gears 210 to a telescopic universal joint 212 which is connected to a mechanical drive element 214. The drive element 214 extends through the end plates 44 of the second side port 32. The screw shaft 206 is rotated by a motor 218 which may be controlled by the motion controller system 186.

The universal joint 212 and drive element 214 for the vertical translation/focusing system are structurally similar to the joints 176, 178 and connectors 170, 172, 174 used to operate the target material support system 22. The universal joints 176, 178, 212 are telescopic in the illustrated embodiment to facilitate the vertical translation of the chamber 20 with respect to the vacuum system 56, described in more detail below.

Figure 8:
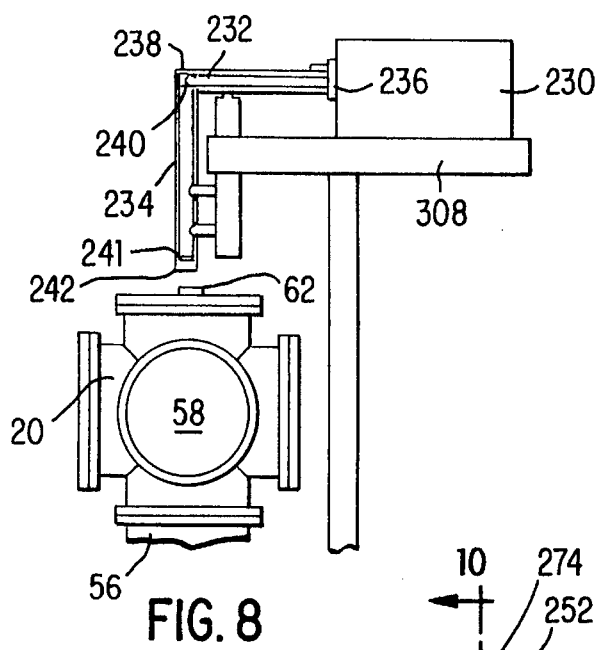
FIG. 8 is a front view of the chamber of FIG. 2 shown together with a laser beam system constructed in accordance with the present invention.

FIG. 8 shows the arrangement for supporting and aligning the laser 230 such that the beam 28 is transmitted vertically through the window 62 and onto the target material. In a preferred embodiment, the laser 230 is a pulsed Nd:YAG laser, such as a SPECTRA PHYSICS GCR-12N laser (75 mJ, $\lambda$=1064 nm, 8 ns, 10 pps, with Gaussian coupled output). The laser may alternatively be a $CO_2$ or Excimer laser.

The laser support and alignment arrangement includes two perpendicular sets of stainless steel rods 232, 234. The first set 232 is connected at one end to the face plate of the laser shutter 236, and at its other end to a mirror mount 238. A low-loss mirror 240 is mounted at 45° to the horizontal and redirects the beam 28 by 90°.

The second set of rods 234 is connected at one end to the mirror mount 238 and at the other end to an adjustable lens holder 242. A fused quartz plano-convex lens 241 is mounted inside the lens holder 242. In the illustrated embodiment of the invention, the lens 241 has a focal length of 25.4 cm, and the lens holder 242 may be moved vertically a distance of about 2 to 4 cm.

The laser 230 and support rods 232, 234 are supported on support frame 308. The laser stand is self-standing apart from the integrated assembly of the chamber 20, target material support system 22, vacuum system 56 and cabinet 296 as shown in FIG. 1. This allows the chamber 20 mounted on cabinet 296 to be moved on wheels 298 out from under the laser 230 and associated structure to facilitate hoisting chamber 20 up off cabinet 296, as described in more detail below in connection with FIGS. 12 and 13. Alternatively, the frame 308 can be constructed to allow it to be rolled away from cabinet 296 and chamber 20.

Figure 9:
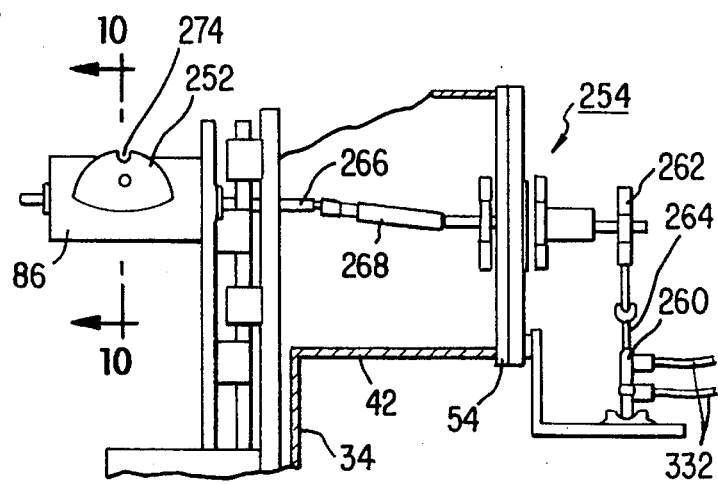
FIG. 9 is a side view of the shutter actuating mechanism.
Figure 10:
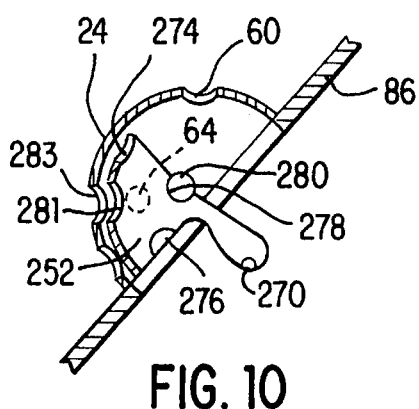
FIG. 10 is a cross-sectional view taken along the line 10—10 of FIG. 9, showing the shutter mechanism in its closed position.
Figure 11:
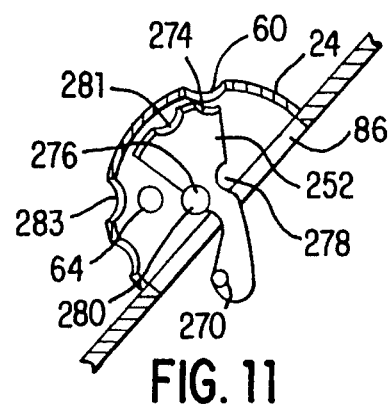
FIG. 11 is a view like FIG. 10, showing the shutter mechanism in its open position.

A computer-controlled shutter system for selectively covering the substrate 26 is shown in FIGS. 9–11. For purposes of clarity, the shutter system is not shown in the other figures. Also, for purposes of clarity, the hemispherical support member 24 is not shown in FIG. 9, but is shown in FIGS. 10 and 11.

The shutter system includes a pivotable shutter 252 and a shutter actuation system 254 for moving the shutter 252 between its closed position (FIGS. 9 and 10) and its open position (FIG. 11). The purpose of the shutter system is to selectively control the rate of deposition of target material onto the substrate 26. When the shutter 252 is in its closed position, the plume 30 cannot reach the substrate 26 (positioned over the opening 64) and target material is not deposited on the substrate 26. When the shutter 252 is in its open position, the deposition of target material onto the substrate 26 is continued. Thus, the shutter system may be used to control the thickness and final characteristics of thin film devices formed within the chamber 20.

In operation, a signal causes the extension and retraction of a pneumatic cylinder 260 (FIG. 9), causing rotation of a shutter arm 262 through a link arm 264. The shutter arm 262 is connected to a main shaft 266 via a telescopic universal joint 268. The main shaft 266 rotates through 45° and is connected to a shutter actuator arm 270 (FIGS. 10 and 11). The arm 270 is moved to open and close the shutter 252. The shutter actuator arm 270 may be integrally formed with the shutter 252. The universal joint 268 allows for vertical translation of the substrate holder 24 and the support platform 86.

The shutter 252 has a laser window 274 arranged so as to be aligned with the top opening 60 when the shutter 252 is in the open position. The shutter 252 also has first and second cutouts 276, 278 so as not to obstruct a view port 280. The purpose of the view port 280 is to permit observation of the deposition process and the components located within the substrate holder 24. In the open position (FIG. 11), the first cutout 276 is located over the view port 280. In the closed position, the second cutout 278 is located over the view port 280.

The shutter 252 has another opening 281 so that opening 283 for the thickness monitor head 67 is not covered by the shutter 252.

Figure 12:
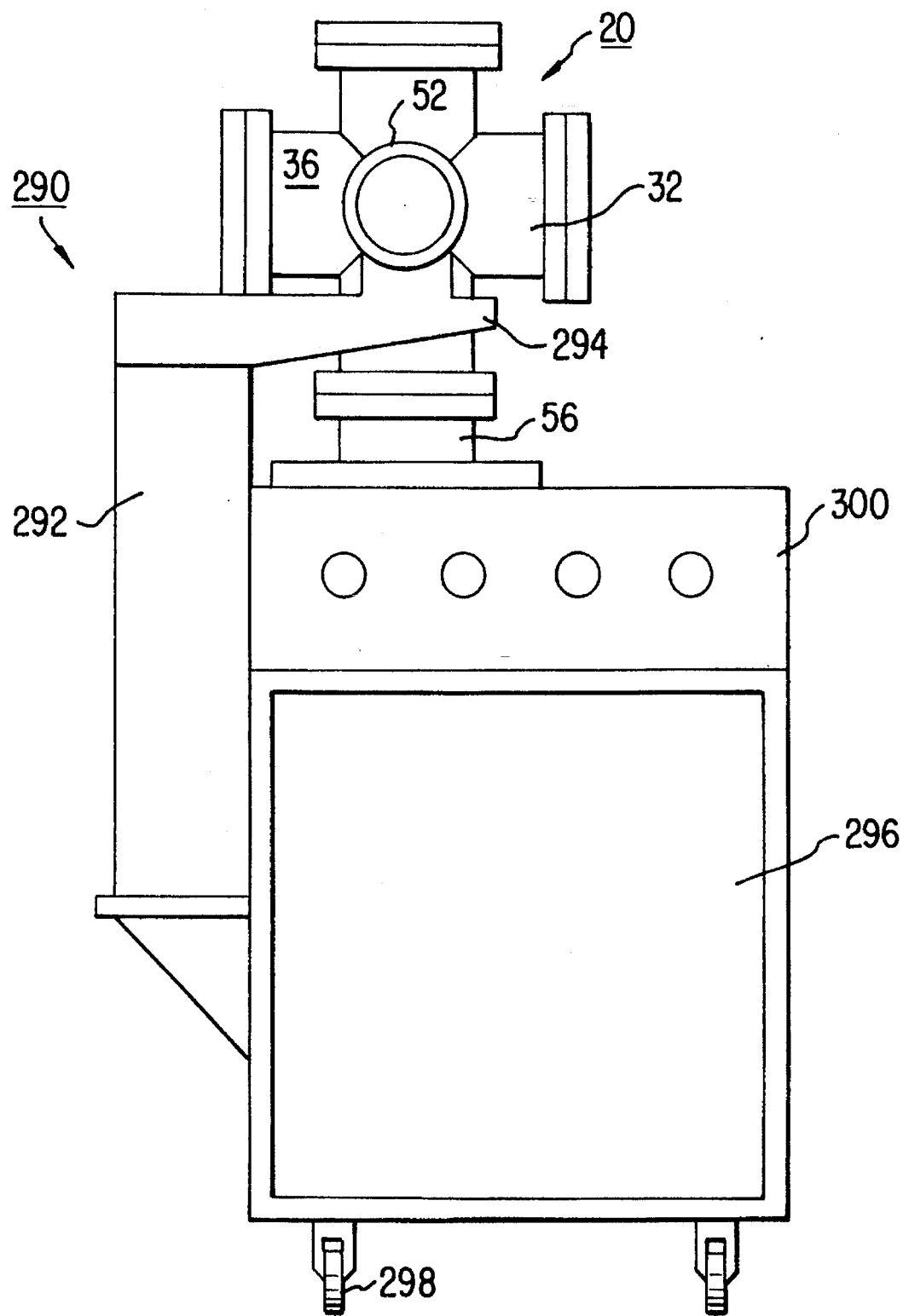
FIG. 12 is a side view of the laser ablation deposition system of FIG. 1 illustrating the hoist assembly and vacuum system constructed in accordance with the present invention.
Figure 13:
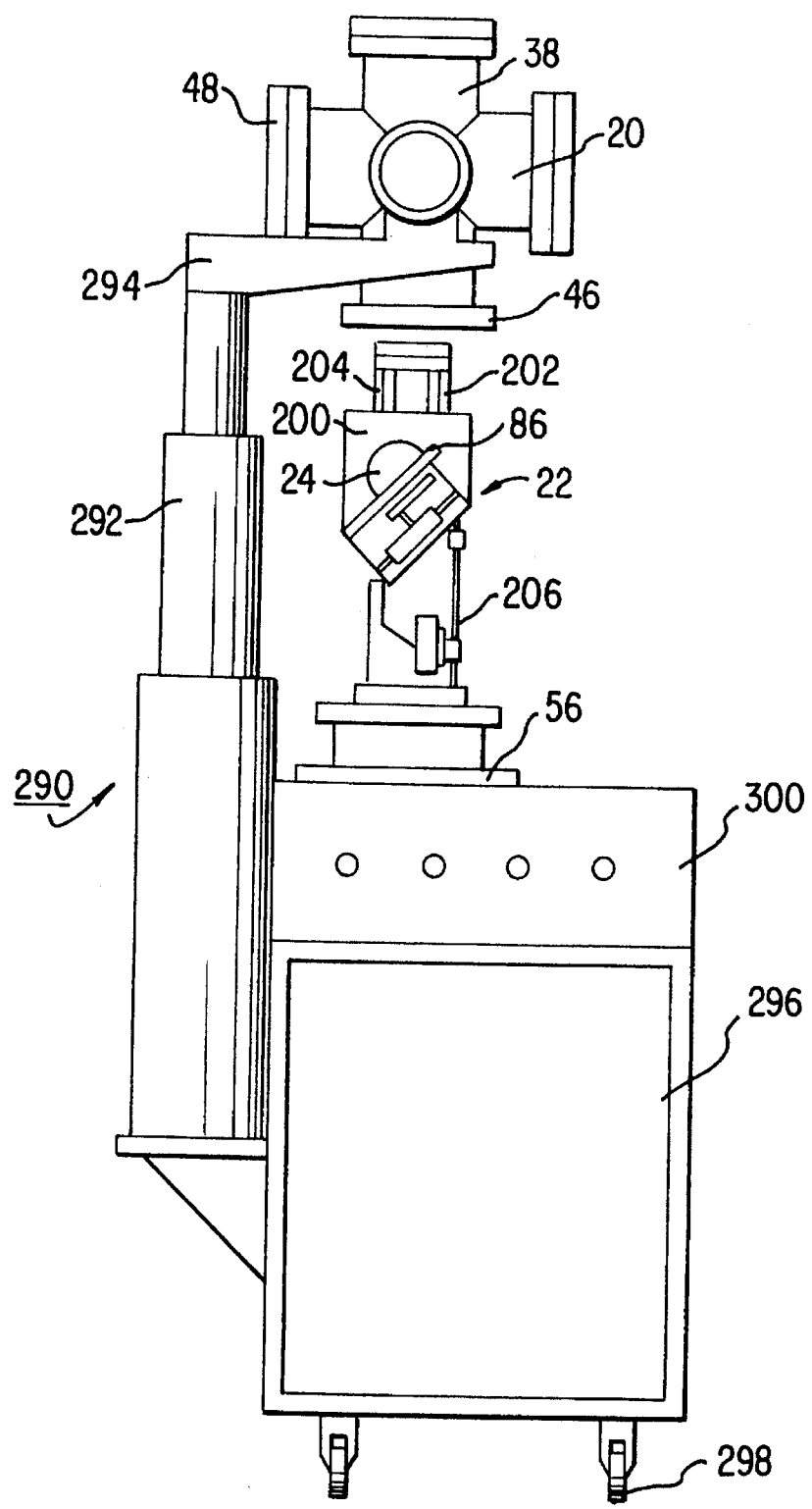
FIG. 13 is a view like FIG. 12, with the hoist assembly in its extended position.

FIGS. 12 and 13 show a hoist assembly 290 which lifts the laser ablation deposition chamber 20 off of the vacuum system 56. The hoist assembly 290 includes a motor driven lead screw within telescoping column 292 and prongs 294 for lifting the chamber 20. The hoist assembly 290 is in turn supported on cabinet 296 which also contains vacuum system 56. The cabinet 296 is supported on wheels 298 for portability. The motor for the hoist assembly 290 is integrally mounted within the hoist. The hoist may be a commercially available Magnetic Corp. Telemag Telescoping Lift model number LC 12ZWAK 2U-005, or equivalent.

The hoist assembly 290 makes it possible to gain easy access to the various components normally located within the chamber 20, as shown in FIG. 13. The various components may be serviced, replaced and/or upgraded while the chamber 20 is in the FIG. 13 position. Also, while the chamber 20 is in the FIG. 13 position, it is possible to empty a residue dish (not illustrated) of unablated particles. The residue dish may be located within port 56 underneath the target platforms 100, 102, 104.

The connection between the chamber 20 and the vacuum system 56 formed by the end plates 46 is readily disconnectable for convenient operation of the hoist assembly 290.

Figure 14:
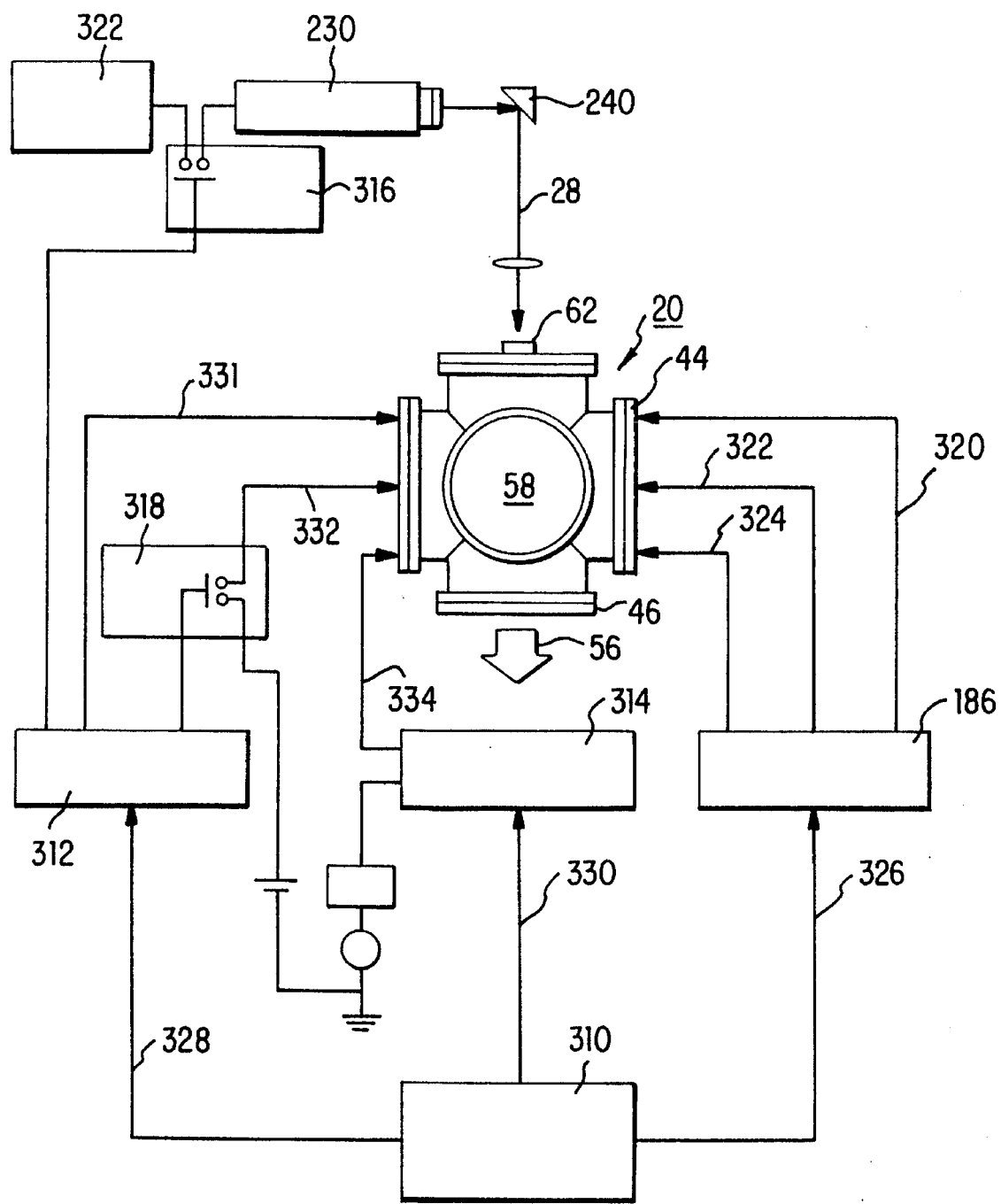
FIG. 14 is a schematic view of an integrated computer-controlled laser ablation deposition system constructed in accordance with the present invention.

FIG. 14 illustrates the main system modules of an integrated computer control system for providing subsystem control of the laser ablation deposition system. The computer 310 controls five main subsystems: thickness monitor 312, temperature controller 314, three axis motion controller 186, laser control 316 and sample shutter control 318.

The motion controller system 186 supports a custom ribbon cable interface between a computer installed bus board and the external motor controller/driver unit. The controller board can be installed in an available bus slot within an 80386 personal computer and the ribbon cable can be connected between the bus board and the backplane of an external motor controller/driver unit. Cables 320, 322, 324 connect the backplane of the external motor controller/driver to the respective motors 180, 182, 184. The computer 310 is connected to the motion controller system 186 by an electrical communication line 326.

Thickness monitor 312 and temperature controller 314 utilize standard RS-232 (DB-9) interfaces 328, 330 with the COM1 and COM2 serial ports on the 80386 personal computer 310. The laser control 316 and the sample shutter control 318 are controlled and actuated by set point thickness and end thickness relays housed within the thickness monitor 312. The computer interface control signals for shutter operation are transmitted through a computer-to-thickness monitor RS-232 serial cable 331.

Sample shutter control 318 is connected to the pneumatic cylinder 260 (FIG. 9) by signal line 332. Temperature controller 314 is connected to the thermocouple connector 74 (FIG. 2) by signal line 334.

A high-level graphical user interface (GUI) may be provided to allow an operator to access all the parameters which are available remotely from each of the external subsystem devices: thickness monitor 312, temperature controller 314, and motion controller 186. The GUI may support keyboard entry fields, data display fields, data time history plotting curves and manual control features using simulated switches. These interfaces can provide the operator with detailed information concerning each of the control subsystems. The operator is able to access detailed information from each of the subsystems for testing, monitoring and fault analysis.

The GUI can also be used to automatically control the five main subsystems 312, 314, 186, 316, 318. A control panel may be used to monitor the deposition parameters of the subsystems, the set point and present temperature of the substrates, allowed temperature deviation and time of deposition in the temperature controller subsystem; target identification for laser ablation, layer number, total number of layers, target rotation speed and target tracking (radius selection) in the target selector subsystem; display thickness, set point thickness, deposition rate and total thickness of the films in the thickness monitor subsystem; and laser and target shutter for open and closed positions.

Figure 15:
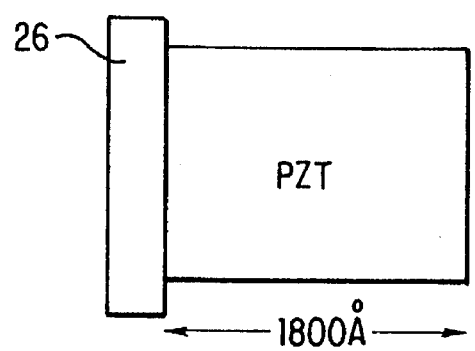
FIG. 15 is a schematic representation of one type of a ferroelectric thin film device fabricated by the system illustrated in FIGS. 1–14.

FIG. 15 is a representation of one type of thin film structure which can be fabricated with laser ablation deposition system 10. In FIG. 15, a single pellet of PZT target material is ablated until the material of a desired thickness is deposited onto substrate 26. The target platform in use (100, 102, and/or 104) is simultaneously rotated and/or lineary translated to continuously expose fresh target material to the laser beam 28.

Figure 16:
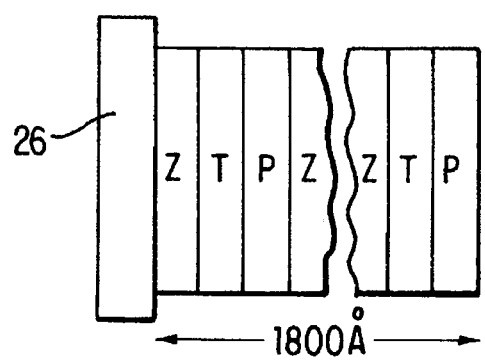
FIG. 16 is a schematic illustration of a second type of ferroelectric thin film device fabricated by the system illustrated in FIGS. 1–14.

FIG. 16 is a representation of a second type of thin film structure which can be fabricated with laser ablation deposition system 10. FIG. 16 represents a PZT ferroelectric thin film fabricated by ablating individual PbO, $ZrO_2$, and $TiO_2$ pellets (P, Z and T pellets, respectively) supported on the target platforms 100, 102, 104, respectively, in order. In operation, material is deposited onto the substrate 26 by successively ablating the pellets in the following order: Z, then T, then P, with this order being repeated a number of times depending on the desired thickness of the film. For example, the thickness may be 1800 A as illustrated.

For the sequence illustrated in FIG. 16, the first target platform 100 is located under the laser beam 28 during the deposition of the P layers, the second target platform 102 is located under the laser beam 28 during the deposition of the Z layers, and the third target platform 104 is located under the laser beam 28 during the deposition of the T layers.

Figure 17:
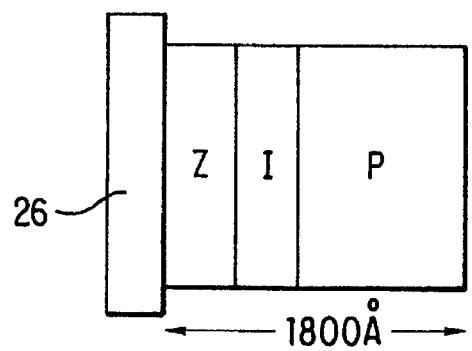
FIG. 17 is a schematic illustration of a third type of ferroelectric thin film device fabricated by the system illustrated in FIGS. 1–14.

FIG. 17 illustrates a third deposition sequence which can be performed with the present invention. According to the sequence illustrated in FIG. 17, the ferroelectric thin film device may be formed by depositing one Z layer, then one T layer, and then one P layer, for a total thickness of 1800 A. For the sequence illustrated in FIG. 17, as with the sequence illustrated in FIG. 16, the first, second and third target platforms 100, 102 and 104 are located under the laser beam 28 during the deposition of the P, Z and T layers, respectively. The multi-target rotation table 118 is rotated around the central shaft 124 after the deposition of each layer. Throughout the deposition process, the target platforms 100, 102, 104 are simultaneously rotated and/or linearly translated to continuously expose fresh target material to the laser beam 28.

The thicknesses of the PZT thin film device produced by the present invention is determined by the requirements of the memory device. The net polarization of the thin film is dependent on the thickness of its layers. Typically, the thin film thicknesses will range from 0.1 to 0.4 um.

Use of the present invention is not limited to the ablation of individual metal oxide pellets. The target material may be formed of bulk PZT powders or bulk PZT ceramics, or individual metals (Pb, Zr, Ti) which are oxidized and post-annealed after deposition. When bulk powders are selected as the target material, they are ablated in order such that a PZT layer is formed next to the substrate or contact layer.

Further, the present invention may be used to ablate and deposit materials other than the ferroelectric materials discussed above. For example, platinum, lanthanum strontium cobalt oxide, and/or other materials may be located on the platforms 100, 102, 104 and ablated to form suitable electrodes and/or buffer layers on the substrate 26.

While the invention has been described with reference to specific embodiments, it will be apparent to those skilled in the art that many alternatives, modifications and variations may be made. Accordingly, it is intended to embrace all such alternatives, modifications and variations that may fall within the spirit and scope of the appended claims.

What is claimed as new and desired to be protected by Letters Patent of the United States is:

1. A laser ablation deposition system for depositing material onto a substrate, said system comprising:

a chamber;

a vacuum system connected to said chamber;

a first movable platform for supporting said material, said first movable platform being located within said chamber;

a substrate support structure for supporting said substrate, said substrate support structure being located within said chamber;

a laser for generating a laser beam for ablating said material, such that said material is deposited onto said substrate;

a chamber support structure, wherein said chamber is mounted on said chamber support structure;

a support frame, wherein said laser is supported on said support frame; and a carriage for vertically moving said first movable platform and said substrate, said carriage being located within said chamber.

2. The system of claim 1, further comprising a hoist for lifting said chamber to expose said movable platform and said substrate support structure.

3. The system of claim 2, wherein said hoist is mounted on said chamber support structure.

4. The system of claim 3, wherein said chamber support structure and said support frame may be separated to provide clearance for said hoist to lift said chamber.

5. The system of claim 4, wherein said chamber is cross shaped and includes two ports, and wherein said hoist lifts said chamber by supporting said two ports.

6. The system of claim 1, wherein said first movable platform is rotatable about a first axis.

7. The system of claim 6, wherein said first movable platform is rotatable about a second axis.

8. The system of claim 7, wherein said platform is movable in a lateral direction substantially perpendicular to said first axis.

9. The system of claim 8, further comprising second and third movable platforms for supporting said material.

10. The system of claim 9, further comprising target select means for moving said first, second and third first movable platforms into position for said material to be ablated by said laser beam.

11. The system of claim 1, further comprising a heater for heating said substrate.

12. The system of claim 1, wherein said substrate support structure is hemispherical.

13. The system of claim 12, wherein said substrate support structure defines a first opening aligned with said laser beam and a second opening for exposing said substrate to a plume of said material.

14. The system of claim 13, further comprising a movable shutter for selectively covering said second opening, said shutter being located within said hemispherical support structure.

15. The system of claim 14, further comprising an extendible shaft for operating said shutter.

16. The system of claim 1, further comprising a carriage shaft for slidably supporting said carriage, and a carriage drive for moving said carriage to focus said laser beam on said material.

17. The system of claim 1, further comprising a thickness monitor for monitoring the thickness of said material on said substrate.

18. The system of claim 17, further comprising a temperature sensor for measuring the temperature of said substrate.

19. The system of claim 18, further comprising a control system for receiving signals from said thickness monitor and said temperature sensor, and for controlling said laser ablation system responsive to said signals.

20. The system of claim 19, wherein said control system is mounted on said support frame.

21. The system of claim 19, wherein said control system includes a computer.

22. A laser ablation deposition system for depositing material onto a substrate, said system comprising:

a chamber;

a vacuum system connected to said chamber;

a first movable platform for supporting said material, said first movable platform being located within said chamber;

a substrate support structure for supporting said substrate, said substrate support structure being located within said chamber;

a laser for generating a laser beam for ablating said material, such that said material is deposited onto said substrate;

a chamber support structure, wherein said chamber is mounted on said chamber support structure;

a support frame, wherein said laser is supported on said support frame;

second and third movable platforms for supporting said material;

target select means for moving said first, second and third movable platforms into position for said material to be ablated by said laser beam;

wherein said target select means includes a shaft, a telescopic universal joint connected to said shaft, and a motor for rotating said universal joint;

wherein said first movable platform is rotatable about a first axis;

wherein said first movable platform is rotatable about a second axis; and wherein said first movable platform is movable in a lateral direction substantially perpendicular to said first axis.

* * * * *